(12) United States Patent
Campos et al.

(10) Patent No.: US 9,817,930 B1
(45) Date of Patent: Nov. 14, 2017

(54) METHOD, SYSTEM, AND COMPUTER PROGRAM PRODUCT FOR VERIFYING AN ELECTRONIC CIRCUIT DESIGN WITH A GRAPH-BASED PROOF FLOW

(71) Applicant: Cadence Design Systems, Inc., San Jose, CA (US)

(72) Inventors: Caio Araujo Texeira Campos, Belo Horizonte (BR); Tamires Vargas Campanema Franco Santos, Belo Horizonte (BR); Andrea Iabrudi Tavares, Belo Horizonte (BR); Fabiano Peixoto, Belo Horizonte (BR); Claudionor Jose Nunes Coelho, Jr., Nova Lima (BR)

(73) Assignee: Cadence Design Systems Inc., San Jose, CA (US)

(*) Notice: Subject to any disclaimer, the term of this patent is extended or adjusted under 35 U.S.C. 154(b) by 73 days.

(21) Appl. No.: 14/588,260

(22) Filed: Dec. 31, 2014

(51) Int. Cl.
  *G06F 9/455* (2006.01)
  *G06F 17/50* (2006.01)

(52) U.S. Cl.
  CPC .............................. *G06F 17/5045* (2013.01)

(58) Field of Classification Search
  USPC ......................................................... 716/106
  See application file for complete search history.

(56) References Cited

U.S. PATENT DOCUMENTS

| 8,131,768 | B2 | 3/2012 | Sinha | |
| 8,875,145 | B2* | 10/2014 | Atterbury | G06F 9/4436 717/140 |
| 2002/0186247 | A1 | 12/2002 | Ohkubo | |
| 2003/0037305 | A1* | 2/2003 | Chen | G06F 17/5022 716/103 |
| 2003/0159124 | A1 | 8/2003 | Fisher | |
| 2005/0010598 | A1* | 1/2005 | Shankar | G06Q 10/06 |

(Continued)

FOREIGN PATENT DOCUMENTS

JP            2003216672 A         7/2003

OTHER PUBLICATIONS

International Search Report and Written Opinion dated Aug. 4, 2014 for PCT/CN2013/086294.

(Continued)

*Primary Examiner* — Bryce Aisaka
(74) *Attorney, Agent, or Firm* — Vista IP Law Group LLP

(57) ABSTRACT

Various mechanisms identify an electronic design model and determine a data propagation diagram by receiving a set of path property sources or destinations, determine a set of helper properties for the data propagation diagram by traversing at least a portion of the data propagation diagram, and verify the electronic design model by examining one or more helper properties and determining verification of the one or more helper properties leads to concrete results to generate verification results. Data propagation diagrams may be annotated with verification results to show verification progresses, highlight sources of complexity, and be further synchronized with waveform displays of one or more traces. Search space may be trimmed during a verification flow to enhance performance of verification engine(s). New start states closer to the final state than the default state may be identified during verification and used to enhance performance of the verification engine.

21 Claims, 13 Drawing Sheets

(56) References Cited

U.S. PATENT DOCUMENTS

| | | |
|---|---|---|
| 2007/0160323 A1 | 7/2007 | Deliwala |
| 2009/0281999 A1 | 11/2009 | Sinha |
| 2009/0292941 A1 | 11/2009 | Ganai et al. |
| 2011/0078644 A1 | 3/2011 | Manohar et al. |
| 2015/0186250 A1* | 7/2015 | Friedler .............. G06F 11/3688 717/124 |

OTHER PUBLICATIONS

Ex-Parte Quayle Action dated Sep. 27, 2012 for U.S. Appl. No. 13/404,403.

Notice of Allowance dated Nov. 15, 2012 for U.S. Appl. No. 13/404,403.

U.S. Appl. No. 15/033,643, filed Apr. 30, 2016 (Not enclosed).

* cited by examiner

METHOD, SYSTEM, AND COMPUTER PROGRAM PRODUCT FOR VERIFYING AN ELECTRONIC CIRCUIT DESIGN WITH A GRAPH-BASED PROOF FLOW

CROSS REFERENCE TO RELATED PATENT APPLICATION

This application is a divisional of U.S. application Ser. No. 12/961,389, entitled "CONSTRAINING TRACES IN FORMAL VERIFICATION" and filed on Dec. 6, 2010, which is hereby incorporated by reference in its entirety.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Modern electronic circuit design such as system-on-chip (SoC) devices or integrated circuit designs have been used in a wide range of systems, ranging from mobile computing devices to automotive control systems. One factor that advances and proliferates these complex electronic circuit devices includes the use of readily available reusable semiconductor intellectual property (IP). Reusable IP provides designers with a variety of proven subsystem blocks, including processors, memory controllers, physical interfaces (PHYs), and input/output (I/O) circuits, just to name a few. The integration of reusable semiconductor IP also adds to the growing challenges facing design verification engineers.

These modern electronic circuit designs often present complex system issues that may be difficult and time consuming to identify and resolve, even for experienced design verification engineers. These issues include verifying whether one or more subsystems of an electronic circuit design operate as designed as well as stressing subsystem interfaces to fully characterize and verify transaction flows between multiple subsystems. While verification tools have improved, current verification methods still require significant expertise and experience to prove or disprove a property efficiently and effectively. And, in some cases, the slow convergence in conventional verification processes of electronic circuit designs, especially in the absence of any visual aid of the progress of a verification task, often delays or impedes the identification and hence debug or fix of verification bottlenecks. Security property verification further exacerbates the ineffectiveness and inefficiencies of conventional verification engines or tools because security property verification works at the chip level and also because of the increased circuit size due to the adoption of path analysis techniques. Conventional verification techniques such as DST and SST are not suitable for such verification tasks because these conventional verification techniques may inadvertently remove structural data paths from verification tasks and thus produce incorrect results.

Therefore, there is an need for an improved approach to enhance the performance, efficiencies, and effectiveness of conventional verification techniques as well to provide visual aids for the progress of verification tasks.

SUMMARY

Disclosed are method(s), system(s), and article(s) of manufacture for verifying electronic designs with a graph-based proof flow in one or more embodiments. One or more embodiments are directed at a method for verifying electronic designs with a graph-based proof flow. In these one or more embodiments, the method may determine a data propagation diagram for an electronic design model with a data propagation diagram generation mechanism that includes at least one processor and receives a set of path property sources or destinations in the electronic design model via a network component or a bus architecture to determine the data propagation diagram, determine a set of helper properties for the data propagation diagram by using a helper property generation mechanism including the at least one processor that executes a sequence of instructions to traverse at least a portion of the data propagation diagram, and verify the electronic design model with a verification engine including the at least one processor that examines at least one helper property and determines whether verification of the at least one helper property leads to a concrete result to generate verification results for the electronic design model. The electronic design model may include a register transfer level (RTL) model in some embodiments.

In some of these embodiments, the act of determining the data propagation diagram may further determine a set of property data sources or property data destinations from the electronic design model and select a data propagation source or a property data destination from the set. In addition or in the alternative, the act of determining the data propagation diagram may a structural analysis by using the at least one process that starts at the property data source or property data destination and traverses the electronic design model forwards or backwards to determine a plurality of structural paths for the electronic design model.

The act of determining the data propagation diagram may optionally construct the data propagation diagram with the data propagation diagram generation mechanism that uses the set of property data sources or property data destinations as a plurality of nodes and uses the plurality of structural paths in the data propagation diagram. In some embodiments, the act of determining the set of helper properties may include accessing the data propagation diagram via a bus architecture and determining a set of nodes in the data propagation diagram with the helper property generation mechanism, selecting a node from the set of nodes in the data propagation diagram with the helper property generation mechanism, and generating the set of helper properties with the helper property generation mechanism that processes the data propagation diagram from the node to at least one remaining node in the set of nodes.

In addition or in the alternative, the method may include identifying a smaller subset of the set of helper properties with a verification flow management mechanism including the at least one processor that accesses the set of helper properties via a bus architecture or a network component and selects the smaller subset of the set of helper properties. The method may also optionally include presenting verification progress with the data propagation display mechanism including the at least one processor that transforms a representation of the data propagation diagram by annotating the representation of the data propagation diagram with at least a portion of the verification results into an annotated representation of the data propagation diagram to provide visual aid of the verification progress or to indicate the sources of complexity.

In some of the immediately preceding embodiments, the method may comprise the act of presenting the verification progress with the data propagation display mechanism that temporally synchronizes the annotated representation of the data propagation diagram with one or more waveforms of one or more traces in the electronic design model over one or more clock cycles. In addition or in the alternative, the method may include the act of trimming a search space into a smaller search space with at least one processor that identifies and uses one or more verified helper properties to determine one or more new start states and/or one or more unreachable states, the act of enhancing efficiency or performance of the verification engine during a verification flow for the electronic design model by directing the verification engine to search the smaller search space for a remainder of the verification flow for the electronic design model, and the act of enhancing the efficiency or performance of the verification engine during the verification flow for the electronic design model by starting a search from a state closer to a verification target. The method may also optionally identify a selection of at least a portion of the data propagation diagram, determine a modified configuration by applying a modification to a configuration that corresponds to the selection, and modify the graph-based verification flow with the modified configuration.

Some embodiments are directed at a hardware system that may be specially configured to perform any of the methods, processes, or sub-processes disclosed herein to improve the efficiencies (e.g., with a shorter amount of time, a smaller number of computations or processor cycles, etc. for verification tasks,), effectiveness (e.g., proving or disproving most or all properties while leaving fewer or no undetermined properties), and/or performance (e.g., up to 1,000-times improvement in speed of the verification tasks) of verification tasks.

The hardware system may include at least one processor or at least one processor core, which executes one or more threads of execution and is coupled to a system bus architecture and an external bus architecture to perform any of the methods, processes, or sub-processes disclosed herein in some embodiments. The hardware system may further include one or more forms of non-transitory machine-readable storage media or devices to temporarily or persistently store various types of data or information. Some exemplary modules or components of the hardware system may be found in the System Architecture Overview section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some exemplary forms of the non-transitory machine-readable storage media may also be found in the System Architecture Overview section below.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Figure 1A:
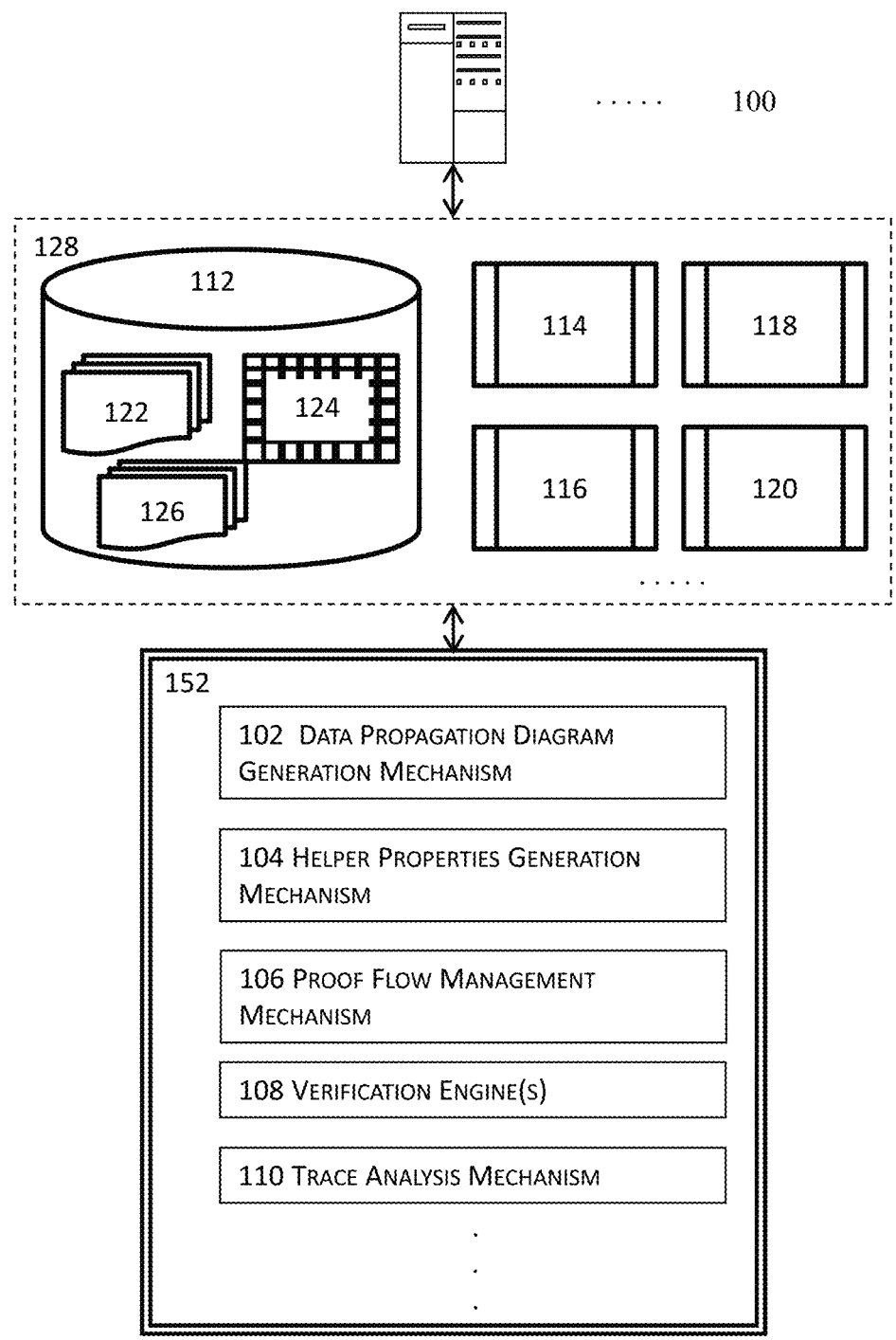
FIG. 1A illustrates a high level block diagram for a system for verifying an electronic design with a graph-based proof flow in one or more embodiments.

Various embodiments of the invention are directed to methods, systems, and computer program products for verifying an electronic design with a graph-based proof flow. Other objects, features, and advantages of the invention are described in the detailed description, figures, and claims.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration. It shall be further noted that the features and advantages described in the specification are not all inclusive and, in particular, many additional features and advantages will be apparent to one of ordinary skill in the art in view of the drawings, specification, and claims. Moreover, the language used in the specification has been principally selected for readability and instructional or explanatory purposes, and may not have been selected to delineate or circumscribe the inventive subject matter.

Various embodiments determine a plurality of paths (e.g., data propagation paths) in an electronic design with a data propagation diagram generation mechanism that identifies the source locations, the destination locations, the input ports, or the output ports in the electronic design and performs a structural analysis to determine the plurality of paths in the electronic design. A structural analysis may include traversing an electronic design forwards and/or backwards and analyzing the data locations thereof and how the data locations are connected in an electronic design, such as flops, multiplexers, etc. When two data locations are connected according to the traversal, the two nodes in the data propagation graph, corresponding to the data locations, may have an edge connecting these two nodes.

A structural analysis may thus be used to generate a data propagation graph. A data propagation diagram may be determined by the data propagation diagram generation mechanism that uses the identified locations or ports to construct the data propagation diagram anew or modify an existing data propagation diagram for the electronic design of interest. Helper assertions or properties (hereinafter helper property or helper properties) may be determined for the nodes in the data propagation diagram by a helper property generation mechanism. A verification engine (e.g., a formal verification engine) may be used to verify path properties by using some or all of the helper properties to determine whether or not the path properties lead to a concrete resolution (e.g., whether a node, which is associated with a path property, is reachable or unreachable, rather than undetermined).

In various embodiments, various techniques described herein may be applied to electronic designs of various abstractions. For example, these techniques may be applied to a registered transfer level (RTL) electronic design and receive an RTL model of an electronic design as an input and apply the graph-based proof flow to verify the RTL level electronic design, to detect bottlenecks in verification tasks, and/or to provide visualization aid for designers to visually see the progress of a verification task. Various techniques may also be applied to verify, prove, or disprove (hereinafter verify) various path properties including, for example, data path properties, security properties, X propagation properties, etc. New start states, which may be closer to the final state than, for example, the design reset state or a previously identified start state, etc. (collectively a "default state") for traversing a data propagation diagram, may also be identified during a verification flow and may further be used to enhance efficiency and/or performance of the verification engine by eliminating the repetitions of the verification tasks from the default state to a new state.

Various embodiments will now be described in detail with reference to the drawing figures. In one or more embodiments, FIG. 1A illustrates a high level block diagram for a system for verifying an electronic design with a graph-based proof flow and may comprise one or more computing systems 100, such as a general purpose computer described in the System Architecture Overview section to implement one or more special proposes. In some embodiments, the one or more computing systems 100 may invoke various system resources such as the processor(s) or processor core(s), memory, disks, etc. via its system bus and/or the external bus.

The one or more computing systems 100 may also initiate or interact with other computing systems via one or more networks to access various resources 128 that may comprise a floorplanner, a global routing engine, and/or a detail routing engine 114, a layout editor 116, a design rule checker 118, a sign-off mechanism 120, etc. The one or more computing systems 100 may further write to and read from, via an external bus architecture, a local or remote volatile or non-volatile computer accessible storage 112 that stores thereupon data or information such as, but not limited to, one or more databases (124) such as schematic design database (s) or physical design database(s), electronic circuit design specification database(s), various statistics, various data, rule decks, various design rules, constraints, etc. (122), or other information or data (126) that may be used to facilitate the performance of various functions to achieve the intended purposes.

In some embodiments, the one or more computing systems 100 may, either directly or indirectly through various resources 128, which reside on the one or more computing system 100 or on one or more other computing systems, to invoke various software, hardware modules or combinations thereof in a multi-fabric design environment 152 that may comprises a plurality of data propagation diagram mechanisms 102 to generate, modify, or otherwise manipulate data propagation diagrams for electronic designs, a helper property generation mechanism 104 to generate helper properties that may be used to aid verification tasks, a proof flow management mechanism 106 to interact with one or more mechanisms (e.g., one or more mechanisms in 152), one or more verification engines 108 to verify various properties for electronic designs, one or more trace analysis mechanisms 110 to analyze a plurality of traces showing the data propagation to various nodes with a graph-based flow. More details about the mechanisms in 152 will be described in subsequent paragraphs with reference to at least FIGS. 1B-5F.

Figure 1B:
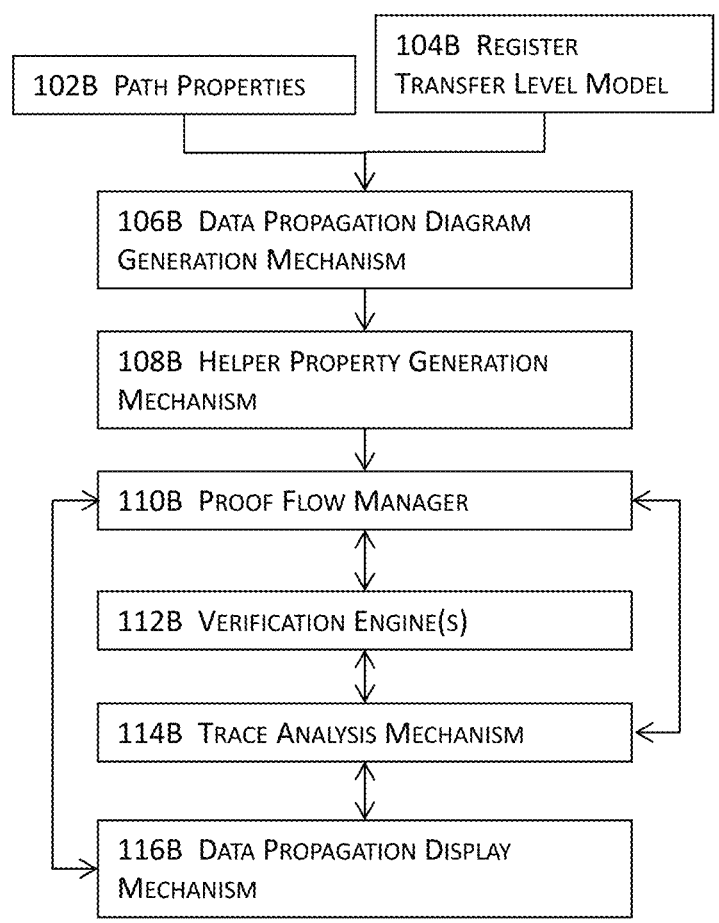
FIG. 1B illustrates a high level block diagram for the interactions of various mechanisms of a system for verifying an electronic design with a graph-based proof flow in one or more embodiments.

FIG. 1B illustrates a high level block diagram for the interactions of various mechanisms of a system for verifying an electronic design with a graph-based proof flow in one or more embodiments. In these one or more embodiments, a data propagation diagram generation mechanism 106B (e.g., reference numeral 102 of FIG. 1A) may receive one or more path properties 102B to be verified and an electronic design 104B as inputs. For an identified path property 102B, the data propagation diagram generation mechanism 106B may determine or extract a set of source locations or destination locations for data propagation in the electronic design 104B and then use the set of source locations and destination locations to determine the data propagation diagram generation mechanism 106B.

A path property comprises a property that is used by, for example, the verification engine 112B, to determine the existence or non-existence of a functional path. A path property may be specified or determined by a user or an EDA tool by using a property description including, for example, "-from A -from_precond B==1 -to D -to_precond C==1 -through E -not_through F". In the aforementioned example, the verification engine 112B may determine whether or not data leaving the data location A when "B==1" is true reaches data location D when "C==1" is true, and the data passes through data location E but not through data location F. A path property may define the data source location and the data destination location and check whether there exists a functional path between the data source location and the data destination locations.

A helper property generated by, for example, the helper property generation mechanism 108B, includes a property that is usually used to aid the verification flow. A helper property may be specified by users or automatically generated by the helper property generation mechanism 108B and may or may not be a target of a verification flow. A helper property may include a smaller subset or the entire set of the parameters of a path property. In some embodiments, a helper property may serve as a verification target as a path property (e.g., the identified path property 102B) does.

In some of these illustrated embodiments, the data propagation diagram generation mechanism 106B may identify the input ports, the output ports, and/or the ioports of the electronic, rather than the property data sources and destinations, to perform a structural analysis to determine the data propagation diagram. For example, the data propagation diagram generation mechanism 106B may analyze serially or in parallel how data flow through the electronic design based in part or in whole upon one or more received or predetermined path properties to generate helper properties to aid the helper property generation mechanism (e.g., reference numeral 104 of FIG. 1).

The data propagation diagram generation mechanism 106B may perform a structural analysis starting from, for example, a data bus in an interface of the electronic design and proceeds forwards and backwards to determine the plurality of paths by traversing one or more edges to which data may be passed from one node to another node in the electronic design.

For example, when the data propagation diagram generation mechanism 106B is provided with a set of source locations, the data propagation diagram generation mechanism 106B may perform a structural analysis to determine the destination locations to which the data in these property data sources may be passed. As another example, when the data propagation diagram generation mechanism 106B is provided with a set of destination locations, the data propagation diagram generation mechanism 106B may perform a structural analysis to determine the source locations from which the data in these destinations may come. In some embodiments, the data propagation diagram generation mechanism 106B may identify input ports, output ports, or ioports, rather than property data sources or destinations as described above.

A data propagation diagram includes a plurality of nodes and a plurality of edges connecting the nodes. The nodes represent data locations (e.g., property data sources and property data destinations) in the circuit design and the edges represent structural paths between the data locations in the circuit design in some embodiments. In addition or in the alternative, a data propagation diagram is a visual representation of possible locations in the circuit design where valid and/or invalid data may be located during operation of the circuit design, as well as paths for data propagation between these locations. It shall be noted that in addition to verifying whether or not valid data may be propagated in some embodiments, various techniques described herein may also be used to verify whether or not invalid data may be propagated in, for example, an X-propagation verification flow.

The data propagation diagram is a high-level view of data flow that appears simpler than a schematic representation of the circuit design and can omit detailed information about individual circuit elements (e.g. flops, gates, circuit elements) of the circuit design that would otherwise distract a circuit designer. The data propagation diagram generation mechanism 106B may be operatively coupled to the helper property generation mechanism 108B which may receive the data propagation diagram generated by the data propagation diagram generation mechanism 106B and generate helper properties from the data propagation diagram. For example, the helper property generation mechanism 108B may receive or identify a set of nodes in a data propagation diagram and generate helper properties starting from an initial node to all or some of the remaining nodes in the data propagation diagram by traversing the data propagation diagram forward from the initial node in some embodiments.

In other embodiments, the helper property generation mechanism 108B generate helper properties ending on the last node from all or some of the remaining nodes in the data propagation diagram by traversing the data propagation diagram backward from the last node. In some other embodiments, the helper property generation mechanism 108B may generate helper properties starting from an intermediate node situated between the initial node and the last node by traversing the data propagation diagram in the forward and/or backward direction based in part or in whole upon, for example, the determination of proof flow manager 110B of FIG. 1B. In some of these aforementioned embodiments, an initial node may include a node in a data propagation diagram that corresponds to no incoming edges, whereas a last node in the data propagation diagram includes the node that corresponds to no outgoing edges.

Figure 4A:
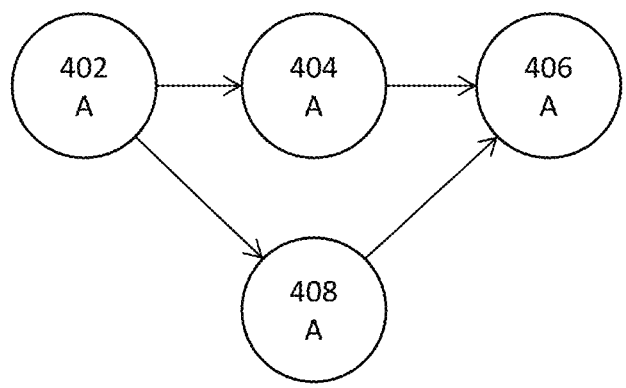
FIGS. 4A-D illustrate an example of using a graph-based flow for verifying a simplified electronic design with a simplified data propagation diagram in some embodiments.

A data propagation diagram may have one or more initial nodes and/or one or more last nodes in some embodiments. As a practical example illustrated in FIG. 4A, given a graph from node A to node D that immediately neighbor intermediate nodes E and F, the helper property generation mechanism 108B may generate the properties "-from A -to D", "-from A -to E", and "-from A -to F"; "E" denotes the data location corresponding to node 404A; and "F" denotes the data location corresponding to node 408A in FIG. 4A. The helper property generation mechanism 108B may not necessarily start from the initial node in the set. Therefore, the helper property generation mechanism 108B may also generate helper properties ending on the last node in the set from all or at least some of the remaining nodes in the data propagation diagram in some embodiments.

The proof flow manager 110B may identify the helper properties generated by the helper property generation mechanism 108B and optionally select at least one of the generated helper properties and forward the selected at least one helper property to one or more other mechanisms such as the verification engine 112B, the trace analyzer 114B, and/or the data propagation display mechanism 116B based in part or in whole upon one or more strategies. The one or more strategies may include, for example, sending all helper strategies to the one or more other mechanisms.

Even when all the helper properties are transmitted to, for example, a verification engine 112B, these helper properties may aid the verification engine 112B to identify new start states or unreachable states, where the new start states may be closer to the final state than, for example, the design reset state or previously identified new start states without these helper properties, and unreachable states may be used to reduce or trim the search space for the verification engine 112B and hence reduce the amount of computation, the number of processor cycles, and/or the amount of data transmitted via various networks (if required) or various bus architectures and interfaces to render a verification task more efficient and effective and to shorten the time required to complete the verification task.

In the alternative, the one or more strategies may include sending only relevant helper properties of the next layer to, for example, the verification engine 112B. For an embodiment of traversing forward from, for example, an initial node or an intermediate node between the initial node and last node, a property may be considered relevant if at least one incoming edge connects a node associated with the property to another node which has its associated property determined to be reachable. In another embodiment involving a backward traversal from a last node or an intermediate node, a property may be considered relevant if at least one outgoing edge connects a node associated with the property to another node which has its associated property determined to be reachable.

For example, when given a helper property that describes the path from the initial node to an intermediate node, if the verification engine 112B determines that the intermediate node is not reachable, the paths stemming from this intermediate node and the properties corresponding to these paths may be excluded from further analysis. Considering the example illustrated in FIG. 5D, if node 502D is determined to be unreachable, the paths 502D-504D and 504D-506D as well as their associated properties (e.g., "-from 502A -to 504D" and "-from 502A -to 506D") may be excluded or removed from further analyses or verification. This may further reduce the search space for the verification engine 112B and thus further enhances the functioning of the computing system on which the verification engine executes. As another example, when given a helper property that describes a path from an intermediate node to an end node, if the verification engine 112B determines that no such a path is possible (e.g., the existence of such a path has been disproved), the path(s) leading to the intermediate node and their associated properties may also be excluded or removed from further analyses.

The proof flow management mechanism 110B may also transmit proof or verification results generated by the verification engine 112B to the data propagation display mechanism 116B which may further annotate the results. For example, the data propagation display mechanism 116B may annotate the reachable and unreachable nodes in the data propagation diagram and display the annotated data propagation diagram as such. Therefore, the data propagation display mechanism 116B transforms a representation of the data propagation diagram into an annotated representation with, for example, textual emphasis, graphical emphasis, or both.

When provided with a set of properties and a path between two nodes in a data propagation diagram as determined by the verification engine 112B, the trace analysis mechanism 114B may show one or more waveforms indicative of data propagation alongside with the data propagation diagram highlighting the data propagation through the waveform cycles. In some embodiments, the verification engine 112B determines the information about the existence or non-existence of functional paths, and the data propagation display mechanism 116B may use this information to annotate the data propagation diagram with graphical emphasis, textual emphasis, or both.

The trace analysis mechanism 114B may also use this information generated by the verification engine 112B to perform the analyses. It shall be noted that this second proof strategy of sending the relevant helper properties, rather than all the helper properties, may also be applied with one or more different strategies or criteria in determining the relevancy of the helper properties, which, in another embodiment, may be performed in the reverse direction where the layer counts start from the last node (or an intermediate node) of the data propagation diagram, and a property is considered relevant when a node in the data propagation diagram connects to the property's node, which has a functional path already proven to exist, on the previous layer.

The verification engine 112B performs verification or proofs of the helper properties of the electronic design of interest. In some embodiments where a helper property selected by the proof flow management mechanism 110B has been proved or disproved by the verification engine 112B, the verification result for this helper property may be relayed back to the proof flow management mechanism 110B to select the next set of one or more helper properties to be verified. The verification result may also be transmitted to the data propagation display mechanism 116B for annotation of the data propagation diagram in some embodiments.

The verification engine 112B may use the data propagation diagram to enhance the path property modeling during verification in some embodiments. In addition or in the alternative, the verification engine 112B may perform enumeration to enumerate all paths for all the nodes in the data propagation diagram. In some embodiments where the verification engine 112B is provided with a disproven property and a set of configurations from, for example, the proof flow management mechanism 110B, the verification engine may search for a new trace by using the set of configurations as one or more constraints and/or one or more new targets for the search. A trace or a signal trace may include signal values of one or more signals over one or more clock cycles and may be determined by, for example, a simulation of the electronic design or a variant thereof or a verification task as a counter example indicative of the violation of a property or assertion. In addition or in the alternative, a trace may show or indicate how a coverage point may be exercised.

The trace analysis mechanism 114B may receive data or information transmitted from the proof flow management mechanism 110B or from the data propagation display mechanism 116B via one or more network elements or bus architectures (e.g., a system bus, an external bus, etc.) to show a trace for a property associated with a data propagation diagram. For example, the proof flow management mechanism 110B may transmit the trace received from the verification engine 112B for a property to the trace analysis mechanism 114B which then processes the received trace to demonstrate how one or more intermediate nodes in the data propagation diagram may receive data from the incoming edge of the data propagation diagram. As another example, when provided with a trace of a helper property, the proof flow management mechanism 110B may identify a condition and use the negation of this condition to identify one or more alternative paths.

As another example where the trace analysis mechanism 114B is provided with a disproven property from proof flow management mechanism 110B, the trace analysis mechanism 114B may present a temporally synchronized display including a first representation of a waveform illustrating the data propagation through one or more cycles of the trace graph and a second representation of the data propagation diagram with the data propagation display mechanism 116B. The temporally synchronized display may be further presented as a part of the user interface to enable, for example, interactive debugging and/or fixing the electronic design verification environment under verification while the verification flow is executing. As yet another example, the trace analysis mechanism 114B may send, via one or more network elements, one or more bus architectures, or a combination thereof, a new problem for a provided set of configurations to the proof flow management mechanism 110B which in turn functions in conjunction with the verification engine 112B to analyze the problem. In the immediately preceding example, the set of configurations may include one or more constraints, one or more targets, or a combination thereof.

The data propagation display mechanism 116B may display the data propagation diagram with annotations from the proof flow management mechanism 110B and/or the trace analysis mechanism 114B in some embodiments. For example, the data propagation display mechanism 116B may display the data propagation diagram with annotations indicative of reachable and unreachable nodes by using the verification results from the verification engine 112B and the data propagation diagram generated by the data propagation diagram generation mechanism 106B.

As another example, the data propagation display mechanism 116B may present a synchronized display of the data propagation diagram with annotations that highlight the data being passed through one or more nodes of the data propagation diagram as well as the display of one or more waveforms of the corresponding signals passing through the one or more nodes by using the trace analysis results from the trace analysis mechanism 114B and the data propagation diagram from the data propagation diagram generation mechanism 106B. In some embodiments, the data propagation display mechanism 116B may also accept a user's request for a waveform display for a reachable node and present the waveform with or without the data propagation diagram.

Figure 1C:
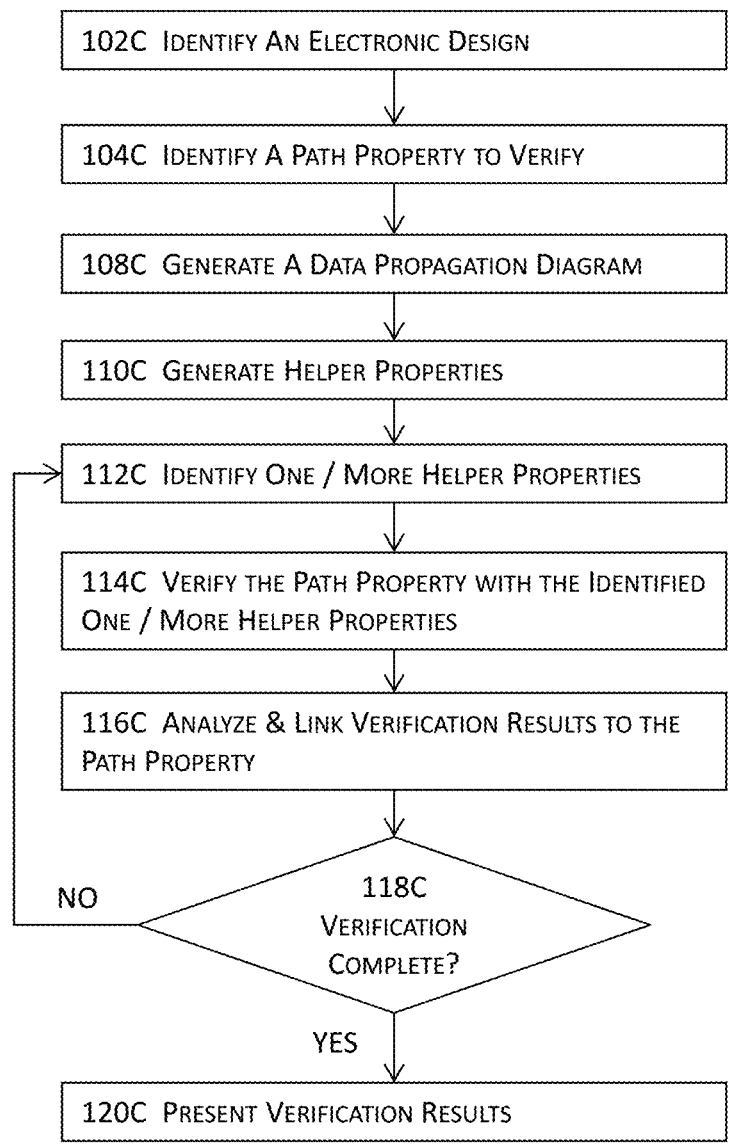
FIG. 1C illustrates a high level block diagram for a method for verifying an electronic design with a graph-based proof flow in one or more embodiments.

FIG. 1C illustrates a high level block diagram for a method for verifying an electronic design with a graph-based proof flow in one or more embodiments. In these one or more embodiments, the method for verifying an electronic design may receive or retrieve an electronic design from one or more network elements or bus architectures at 102C. The electronic design may include an RTL (register transfer level) electronic design model (or simply an "RTL model"). A path property to be verified may be identified at 104C.

In some embodiments, the path property may be specified by a user or automatically generated by an electronic design automation (EDA) tool. A path property may include, for example, "-from A -from_precond B==1 -to D -to_precond C==1 -through E -not_through F". The EDA tool (e.g., the verification engine 112B) may thus check to determine whether any data leaving node A when B==1 is true reaches node D when C==1 is true, and the data are passing through node E but not through node F.

In the aforementioned example, the parameter "-from_precond" is used to specify when the data leaving the starting point should be tagged. Similarly "-to_precond" is used to specify when the tagged data arriving at the final point should be checked. At 108C, a data propagation diagram may be generated by using at least the electronic design from 102C and the path property from 104C. In the above example, the data propagation diagram starts on the path property data source from the "-from" argument and ends on the path property data destination from the "-to" argument. A plurality of helper properties may be generated at 110C from the data propagation diagram, and one or more helper properties may be identified or selected from the plurality of helper properties at 112C based in part or in whole upon a selection strategy in a substantially similar or identical manner as that described above with reference to FIG. 1B.

As described above with reference to FIG. 1B, all of the helper properties may be forwarded to the verification engine in some embodiments, while only a smaller subset of the plurality of helper properties may be forward to the verification engine in some other embodiments. At 114C, the path property may be verified with the identified one or more helper properties. The one or more helper properties may be used to prove or disprove one or more properties so as to reduce or trim the search space for the verification engine and hence reduce the amount of computation, the number of processor cycles, and/or the amount of data transmitted via various network elements (if needed) or various bus architectures and interfaces to render a verification task more efficient and effective and to shorten the time required to complete the verification task.

Using the example illustrated in FIG. 4A, for a part of the data propagation diagram "402A-404A-406A", if data cannot move from the data location A corresponding to node 402A to data location B corresponding to node 404A, there is no need to consider the path from B to the data location C corresponding to node 406A because the path from node 402A to node 404A has been disproven and it implies there is no functional path from A to C through B. If there is no node other than node 404A with outgoing transition reaching node 406A in the propagation diagram (e.g., the paths 402A-408A-406A do not exist in the data propagation diagram), this implies there is no path from 402A to 406A.

At 116C, the verification results may be analyzed and optionally linked to the path property for a path property from 402A to 406C identified at 104C, using the example illustrated in FIG. 4A. For example, an EDA tool housing various mechanisms described herein may identify the verification results from the verification engine (e.g., 112B of FIG. 1B) and compare the verification results to the data propagation diagram to determine whether the path property may be concretely proved or disproved. Using the example illustrated in FIG. 4A, if the path property "-from A -to B" for the path between node 402A and node 404A has be disproven, this verification result (that node 404A is unreachable) may be optionally linked to the path property "-from 402A -through 404A -to 406A" or the path property "-from 404A -to 406A" to aid the verification engine (e.g., 112B of FIG. 1B) to prove or disprove these properties using a forward traversal technique as described previously.

In some embodiments, process 116C may determine one or more nodes as unreachable for the path property under verification when the incoming edges are linked to unreachable nodes. Process 116C may also determine one or more nodes as irrelevant to the path property under verification when the outgoing edges are linked to nodes that cannot reach their target nodes. In some embodiments, process 116C may be repeatedly performed until no more nodes are classified as unreachable or irrelevant. At 118C, it is determined whether the verification task or the proof flow has finished based in part or in whole upon the verification results.

If it is determined that the verification task has finished at 118C, verification results may be presented at 120C. Otherwise, the method may return to 112C to identify one or more additional helper properties and repeat the acts 112C through 118C. At 120C, verification results may be presented to users, and the presentation of the verification results may include, for example, a waveform display showing the data propagation, a textual or graphical indication of non-existence of a data path. In these embodiments, the verification results may be presented on the data propagation diagram with annotations in a substantially similar or identical manner as that described above with reference to FIG. 1B.

Figure 1D:
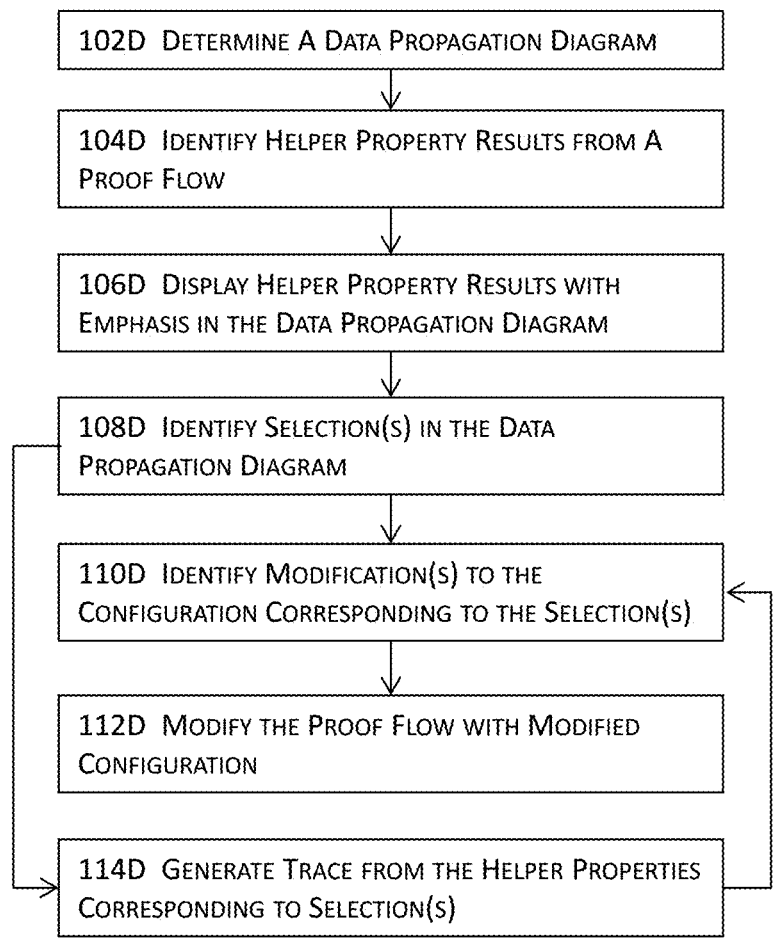
FIG. 1D illustrates another high level block diagram for a method for verifying an electronic design with a graph-based proof flow in one or more embodiments.

FIG. 1D illustrates another high level block diagram for a method for verifying an electronic design with a graph-based proof flow in one or more embodiments. In these one or more embodiments, the method may first determine a data propagation diagram at 102D. For example, the method may generate the data propagation diagram anew, receive or retrieve a pre-generated data propagation diagram, or modify an existing data propagation diagram at 102D. The verification results of helper properties may be identified from, for example, the verification engine at 104D, and the verification results of the helper properties may be displayed or presented with annotations at 106D by using, for example, the data propagation display mechanism 116B of FIG. 1B.

The annotations may, for example, indicate reachable, unreachable, undetermined, and/or irrelevant nodes in the data propagation diagram with emphasis including textual emphasis, graphical emphasis, or a combination thereof. One or more selections in the data propagation diagram may be identified at 108D. For example, one or more user selections of incoming and/or outgoing edges with respect to a node may be identified at 108D. The method may bifurcate and proceed to 114D so that one or more traces may be generated with one or more helper properties that correspond to the one or more selections.

For example, a trace corresponding to data propagation from or to a node included in the one or more selections identified at 108D may be generated at 114D. With the one or more traces generated from the one or more selections, modifications to the configuration that corresponds to the one or more selections may be identified at 110D, and the proof flow or the verification task may be modified to reflect the one or more modifications to the configuration at 112D. The method may perform a new verification task with the configuration based on the modified verification task.

A configuration may include, for example, one or more constraints, one or more new targets, or any combinations thereof for the verification flow. A constraint may include a requirement that forces a signal to a given value or state, and a new target may include a new data propagation destination other than the destinations that have been identified or determined in some embodiments. A configuration may be provided by a user in some embodiments after the user visually inspects the one or more generated traces. As an example where a waveform to a path property "-from A -to E", a trace configuration may force a trace to be frozen and try to extend the data propagation to node D. Alternatively, the method may proceed from 108D directly to 110D to identify one or more modifications to a configuration that corresponds to the one or more selections and then to 110D and 112D in substantially similar or identical manners as those described in the first bifurcated branch.

Figure 2:
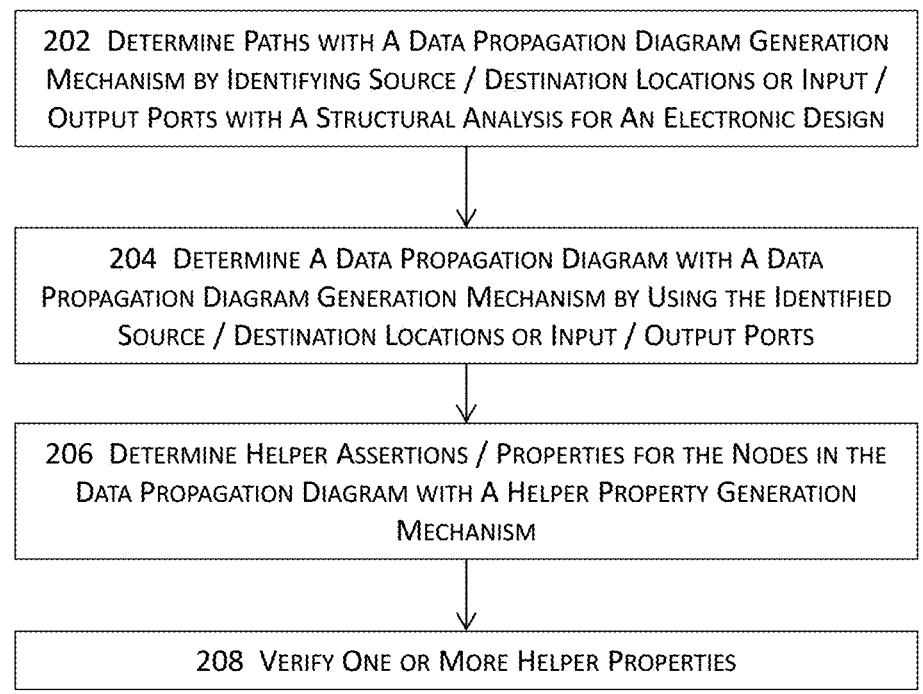
FIG. 2 illustrates a high level block diagram for a method or system for verifying an electronic design with a graph-based proof flow in one or more embodiments.

FIG. 2 illustrates a high level block diagram for a method or system for verifying an electronic design with a graph-based proof flow in one or more embodiments. In these one or more embodiments, paths may be identified for an electronic design with a data propagation diagram generation mechanism by at least identifying a set of data sources or a set of data destinations from the path property 102B with a structural analysis at 202. In some embodiments where the data sources and destinations are not identified, a set of input ports, a set of output ports, or a set of ioports may be alternatively identified for determining paths of the electronic design.

Throughout this application, the term "data source" is used to collectively refer to a source location, an output port, or an ioport for data propagation; the term "data destination" is used to collectively refer to a destination location, an input port, or an ioport for data propagation; and the term "data source or destination" is therefore used to collectively refer to a source location, a destination location, an input port, an output port, or an ioport. The paths may include structural data paths, functional data paths, or any combinations thereof.

The paths of an electronic design of interest may be exhaustive in some embodiments or partial in some other embodiments. For example, given a set of data sources, a structural analysis may be performed to determine where the data at these data sources may be forwarded. Similarly, given a set of data destinations, a structural analysis may also be performed to determine where the data at these destinations or ports may come from. At 204, a data propagation diagram may be determined with a data propagation diagram generation mechanism by using the data sources or data destinations determined at 202 in substantially similar or identical manners as those described for reference numeral 106B of FIG. 1B or reference numeral 108C of FIG. 1C.

Helper assertions or properties may be determined at 206 for the nodes in the data propagation diagram by using, for example, the helper property generation mechanism. In some embodiments, the helper property generation mechanism may receive or identify a set of nodes in the data propagation diagram and generate helper properties starting from the first node or another node to all or some of the remaining nodes in the data propagation diagram. More details about helper property generation are described in 108B of FIG. 1B or 110C of FIG. 1C, and substantially similar or identical techniques may also be used at 206.

At 208, one or more helper properties may be verified by using a verification engine. In some embodiments, these one or more helper properties may be verified sequentially based on, for example, the data propagation diagram. In addition, once a helper property has been verified (e.g., proven or disproven), the search space for the verification engine may be trimmed or reduced to improve the performance and efficiency of the verification engine and the computing system hosting the verification engine.

In some embodiments, these one or more helper properties may be verified in parallel by using multiple threads, multiple cores, multiple processors, or multiple computing systems (collectively computing resource) to further accelerate the verification task. For example, given a simplified data propagation diagram A-B-C, the verification may verify the path property "A-B" to determine whether node B is reachable or unreachable as well as the path property "B-C" to determine whether node C is reachable or unreachable in parallel. One or more load balancing schemes may be optionally utilized to balance the computation load among various computation resources.

Figure 3A:
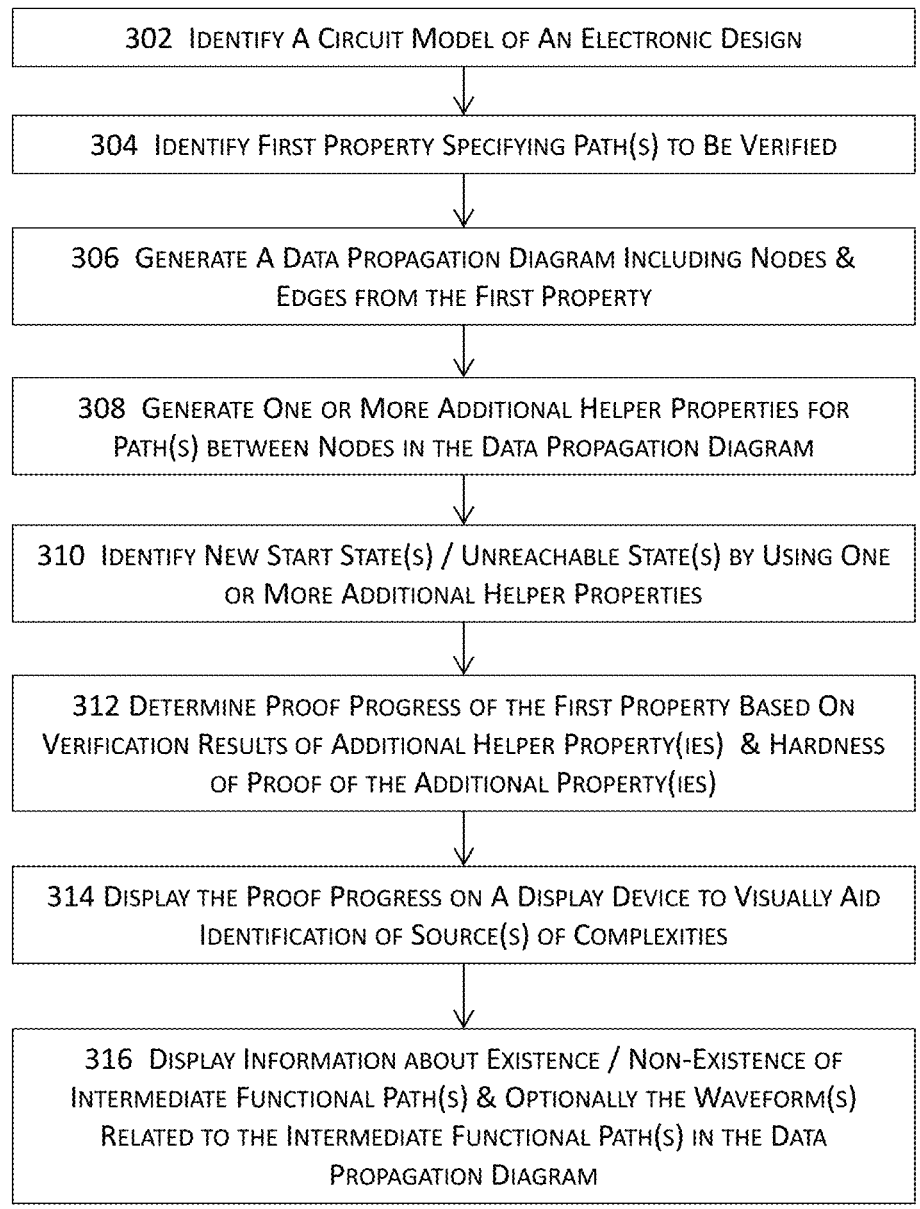
FIG. 3A illustrates another block diagram for a method or system for verifying an electronic design with a graph-based proof flow in one or more embodiments.

FIG. 3A illustrates another block diagram for a method or system for verifying an electronic design with a graph-based proof flow in one or more embodiments. At 302, an electronic circuit model may be identified. An electronic circuit model may include various models of an electronic circuit design at various abstraction levels. For example, an electronic circuit model may include an RTL circuit model of a system-on-chip design. One or more first path properties that specify one or more paths in the electronic circuit model and are to be verified may be identified at 304.

The method may generate a data propagation diagram including a plurality of nodes and a plurality of edges connecting the nodes at 306. The nodes represent data locations in the circuit design and the edges represent structural paths between the data locations in the circuit design in some embodiments. At 308, one or more additional helper properties for paths between the plurality of nodes in the data propagation diagram may be generated. One or more new start states and/or one or more unreachable states may be identified at 310 by proving or disproving the one or more additional helper properties.

New start states may be closer to the final state than, for example, the design reset state or previously identified new start states without these one or more additional helper properties. Unreachable states may be used to trim the search space for the verification engine and thereby reduce the amount of computation, the number of processor cycles, and/or the amount of data transmitted via various networks (if required) or various bus architectures and interfaces to render a verification task more efficient and effective and to shorten the time required to complete the verification task.

At 312, proof progress of the one or more first properties may be determined based in part or in whole upon one or more criteria. The one or more criteria may include, for example, the verification results of the one or more additional helper properties, the hardness of proof of the additional helper properties, etc. The hardness of proof of a property indicates how easy or difficult the property can be verified. For example, a proof that consumes a longer period of time than a prescribed time limit to reach a concrete result (e.g., proven or disproven) may be considered a hard proof, and the longer a proof takes, the higher hardness the proof is in some embodiments.

At 314, the method may display the proof progress on a display device to visually aid the identification of sources of complexities of a verification task. In some embodiments, the proof progress may be displayed in a nearly real-time manner (e.g., a brief delay between the actual progress of a proof flow and the representation of the progress to accommodate the time required for computation and data transmission between various modules) as the verification task or proof flow progresses. In addition or in the alternative, information about the existence or non-existence of one or more intermediate functional paths may be displayed in or alongside the data propagation diagram at 314. At 316, the method may further optionally display the waveforms related to the one or more intermediate functional paths alongside the data propagation diagram in a synchronized manner such that the users may discern the proof progress from either the data propagation diagram, the waveform display, or both.

Figure 3B:
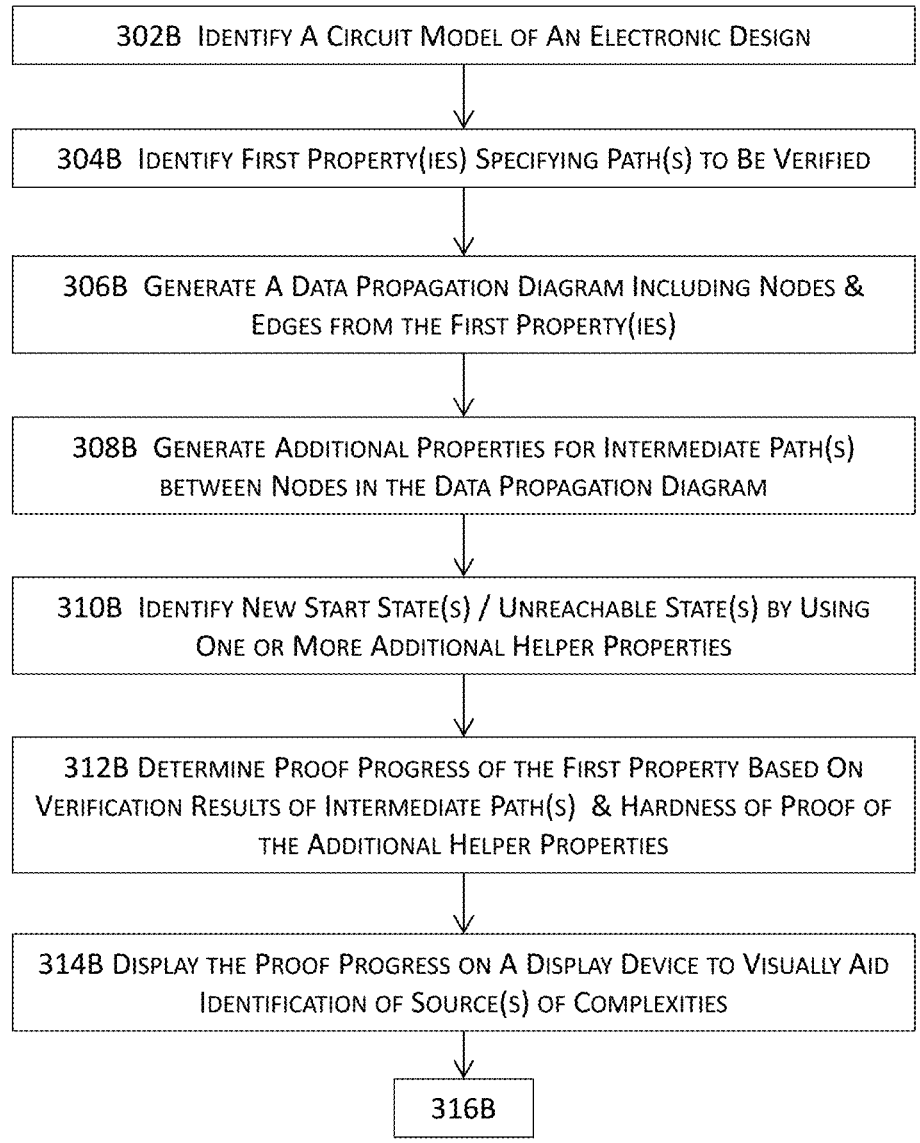
FIGS. 3B-C jointly illustrate a more detailed block diagram for a method or system for verifying an electronic design with a graph-based proof flow in one or more embodiments.
Figure 3C:
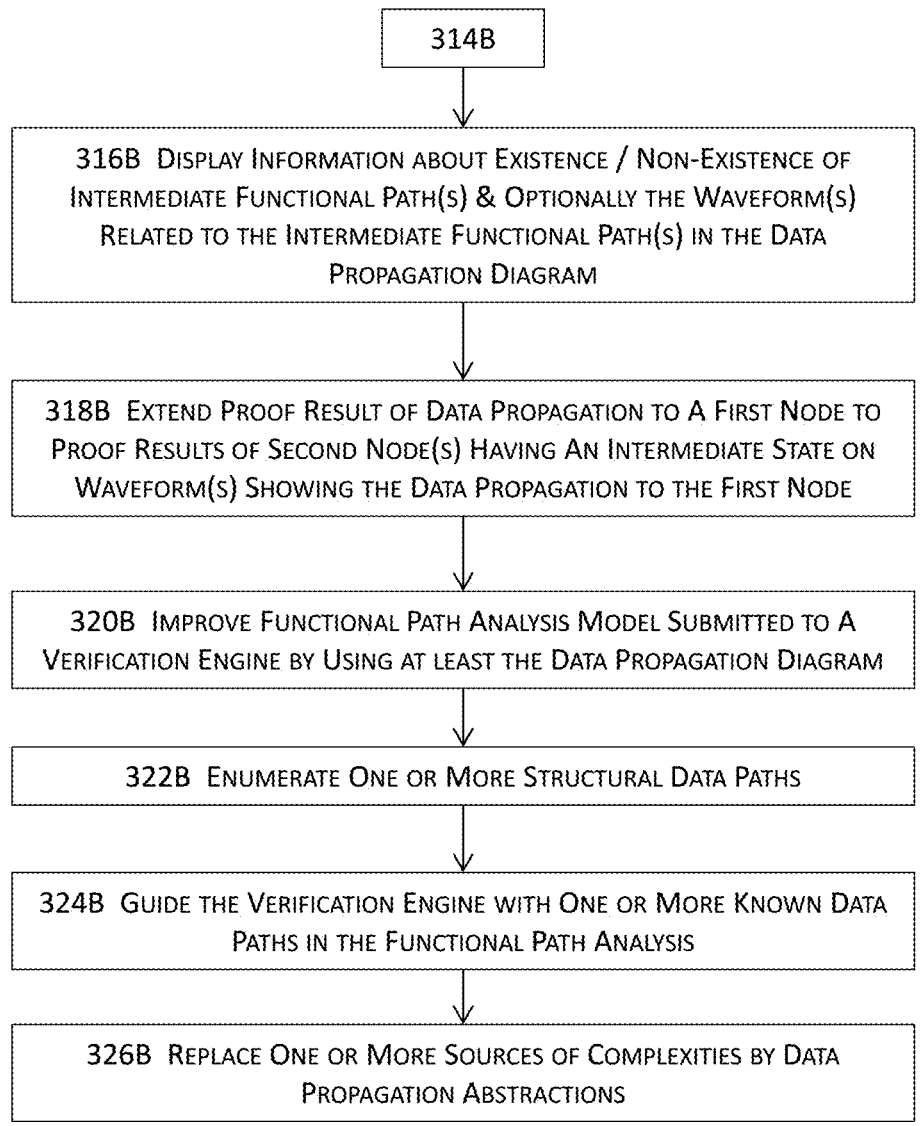

FIGS. 3B-C jointly illustrate a more detailed block diagram for a method or system for verifying an electronic design with a graph-based proof flow in one or more embodiments. The acts in reference numeral 302B, 304B, 306B, 308B, 310B, 312B, 314B, and 316B are substantially similar or identical to 302, 304, 306, 308, 310, 312, 314, and 316 of FIG. 3A respectively, and their respective description will not be repeated. At 318B, the method may extend verification results of data propagation to one node to the proof results of one or more other nodes that have an intermediate state on one or more waveforms showing data propagation to the node.

At 320B, the method may optionally improve the functional path analysis model submitted to a verification engine by using at least the data propagation diagram. One or more structural data paths may also be enumerated to further aid the verification engine at 322B, and one or more known data paths may also be optionally used to guide the verification engine in the functional path analysis at 324B in some embodiments. In addition or in the alternative, one or more sources of complexities identified during verification may be replaced by data propagation abstractions at 326B.

Various techniques described herein provide a more efficient verification mechanism (e.g., having a fewer number of processor cycles, requiring a much shorter time to convergence for the same verification task, fewer network round-trips for data input/output, smaller search space for the same verification tasks, etc.) and a better coverage (e.g., being able to prove or disprove certain formal properties such as security properties that could not be reliably proven or disproven with conventional verification approaches) while providing a visual aid to users to visually identify potential bottlenecks during verification flows as well as to view the verification progress and the existence and non-existence of functional data paths.

FIGS. 4A-D illustrate an example of using a graph-based flow for verifying a simplified electronic design with a simplified data propagation diagram in some embodiments. More specifically, these figures illustrate the use of a data propagation diagram to verify a simplified electronic design. To generate the data propagation diagrams illustrated in FIGS. 4A-D, the following code example may be used:

module top (input clk, input [3:0] A, input B, input C,
        output reg [3:0] D);
      reg [3:0] E;
      reg [3:0] F;
      always @(posedge clk) begin
        D<=(B&C) ? F:E;
        F<=A;
        E<=A;
      end
    endmodule In the above example, "A" denotes the data location (e.g., a flop) corresponding to node 402A; "D" denotes the data location corresponding to node 406A; "E" denotes the data location corresponding to node 404A; and "F" denotes the data location corresponding to node 408A in the data propagation diagram illustrated in FIG. 4A. The aforementioned code includes two data paths from data location A to data location D—the first data path proceeds from node 402A (corresponding to data location A in the design description) to node 406A (corresponding to data location D) through node 404A (corresponding to data location E), and the second data path proceeds from node 402A to node 406A through node 408A (corresponding to data location F) as illustrated in FIG. 4A. Signals B and C represent control signals and are thus not shown in the data propagation diagrams in FIGS. 4A-D.

The path property may be expressed as "-from node 402A -to node 406A". As described above, the helper property generation mechanism may further generate helper properties including "-from node 402A -to node 404A" and "-from node 402A -to node 408A in some embodiments where forward traversal of the data propagation diagram is utilized in the verification flow. An alternate embodiment may also generate helper properties "-from node 404A -to node 406A" and "-from 408A -to 406A" with the backward traversal techniques, which start the traversal from 406A and identify the two incoming edges from nodes 404A and 408A. The next actions of the traversal may traverse from 404A to 402A and from 408A to 402A. One embodiment may generate two helper properties "-from 402A -to 404" and "-from 402A -to 408A" from these two edges. Another embodiment may take the newly traversed node 402A and combine it with the starting point of the backward traversal, and create one helper property "-from 402A -to 408A".

Figure 4B:
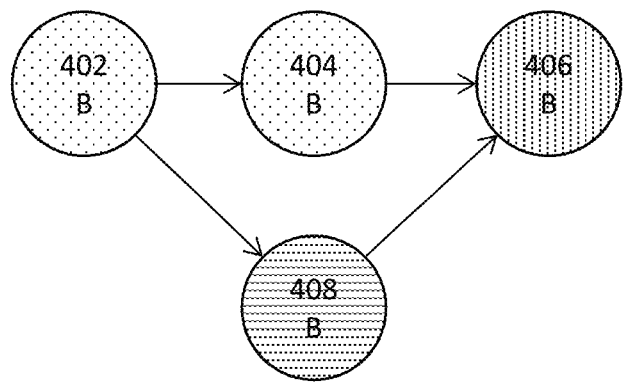

FIG. 4B illustrates an example of annotated proof progress during the verification flow. More specifically, FIG. 4B shows that at one point during the verification flow, it has been proven that a data can reach data location E corresponding to node 404B from the data location A corresponding to 402B; it has been proven that a data cannot reach the data location F corresponding to node 408B from the data location A corresponding to 402B; and concrete verification results (e.g., reachable or unreachable) for whether a data can reach the data location D corresponding to node 406B from the data location A corresponding to 402B have not been determined in the verification flow.

Different nodes in the data propagation diagram may be annotated with different graphical emphasis, textual emphasis, or both to indicate the progress of the verification flow. If concrete verification results for node 406B cannot be determined for some extended period of time (e.g., remaining "undetermined" for a duration longer than a predetermined time period), node 408B with the "unreachable" emphasis may indicate that this node has already been considered by the engines, and thus removed from the verification, and node 408B with the emphasis may indicate that the source of complexity might be related to 406B, indicating that the source of complexity might be related to 406B, which annotation indicates that its associated property is "undetermined". For example, if the annotation of node 406B has indicated the "undetermined" status for an extended period of time, this node 406B may be identified as a potential source of complexity.

Figure 4C:
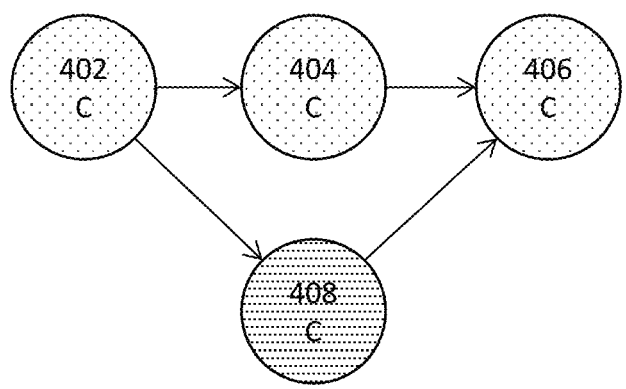
Figure 4D:
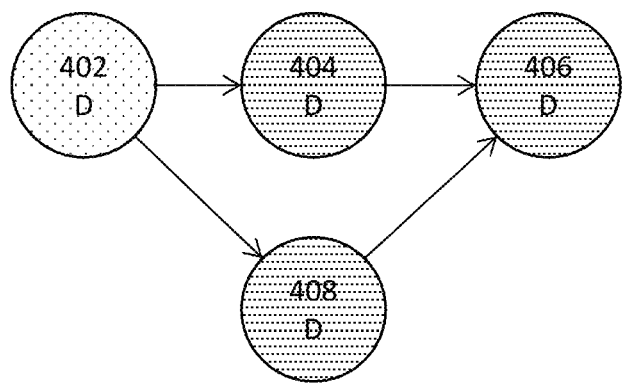

FIG. 4C illustrates the progress of the verification flow in the data propagation diagram after the completion of the verification in some embodiments. That is, FIG. 4C illustrates the final target reached in the verification flow. In this figure, nodes 402C, 404C, and 406C have been proven to be reachable, yet node 408C has been proven to be unreachable. As described earlier, the verification engine or the proof flow management mechanism may remove the analysis of data location F corresponding to node 408C from the state space because this node has been proven to be unreachable. In addition, the system may start from states that are different from the reset state because the verification engine has already identified some reachable states from the verification of the property corresponding to node 402C to node 404C FIG. 4D illustrates an alternative, annotated data propagation diagram to show the proof progress after the verification has been completed in some embodiments. The alternative proof progress may be obtained by using, for example, one or more different constraints to the inputs of the design to be verified. In this annotated data propagation diagram, nodes 404D and 408D have been proven to be unreachable. Because node 406D can only be reached via node 404D or 408D, the verification engine thus need not analyze the property "-from 402D -to 406D" with the verification engine 112B to find out the verification results for node 406D. The results on helper properties from nodes 404D and 408D is sufficient to guarantee that the property "-from 402D -to 406D" is true. Moreover, FIG. 4D shows how the data propagation display mechanism 116B may annotate the data propagation diagram to indicate that there are no available paths to propagate data from node 402D to node 406D because data cannot propagate from node 402D to nodes 404D and 408D, and hence all available paths lead to unreachable states.

Figure 5A:
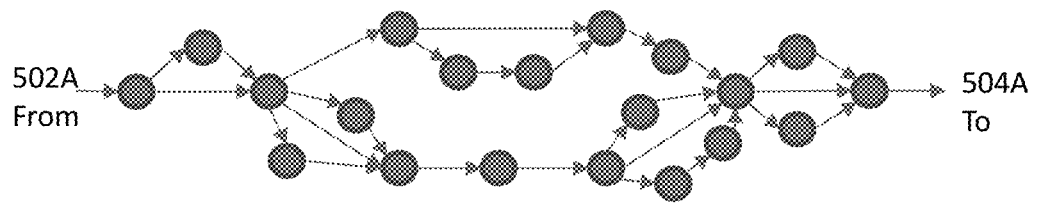
FIGS. 5A-F illustrate another example of using a graph-based flow for verifying a simplified electronic design with another simplified data propagation diagram in some embodiments.

FIGS. 5A-F illustrate another example of using a graph-based flow for verifying a simplified electronic design with another simplified data propagation diagram in some embodiments. More specifically, FIG. 5A illustrates a data propagation diagram, which may be determined by using the data propagation diagram generation mechanism and the processes (e.g., 108C of FIG. 1C, 102D of FIG. 1D, 204 of FIG. 2, 306 of FIG. 3A, 306B of FIG. 3B) of a simplified electronic design. The data generation diagram illustrated in FIG. 5A shows how data may propagate from 502A to 504A via a plurality of nodes and edges that represent the data paths for the simplified electronic design.

Figure 5B:
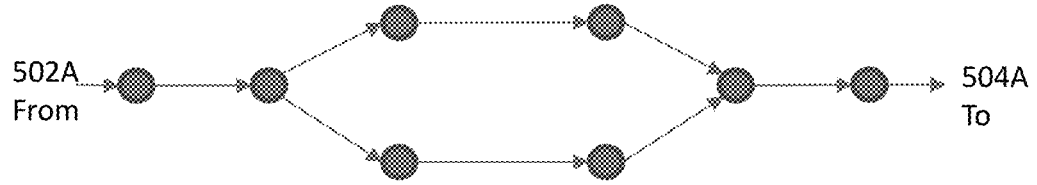

FIG. 5B illustrates an abstraction of the data propagation diagram illustrated in FIG. 5A. The data propagation diagram abstraction illustrated in FIG. 5B maintains only relevant information by using techniques described above with reference to, for example, FIGS. 1B-C. In some embodiments, the data propagation diagram in FIG. 5B may be obtained by filtering the data propagation diagram in FIG. 5A by using, for example, signal types and/or the types of data locations. For example, the abstracted data propagation diagram illustrated in FIG. 5B may be determined by retaining the state holding circuit components (e.g., flops, input ports, output ports, ioports, etc.) in and removing the remaining circuit components from the data propagation diagram illustrated in FIG. 5A in some embodiments. As it can be clearly seen from FIG. 5B, the overhead for verifying this data propagation diagram abstraction has been lessened because the verification engine may access a more selected set of helper properties and thus need not perform as much computation to verify the electronic design. It shall be noted that FIG. 5B illustrate one possible abstraction, and that some of the intermediate nodes and edges not shown in FIG. 5B may be present in other abstractions of the data propagation diagram illustrated in FIG. 5A.

Figure 5C:
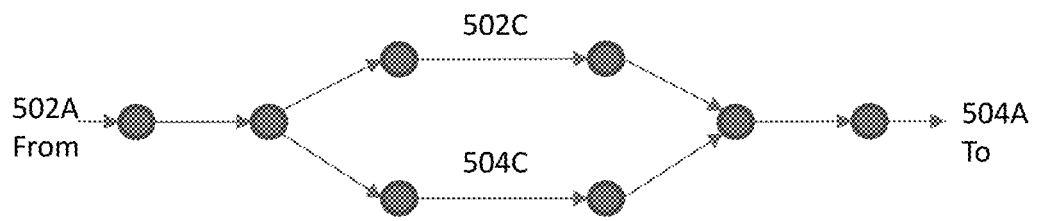

FIG. 5C illustrates the same data propagation diagram abstraction. For security property verification, conventional verification techniques such as blackboxing a portion of the design logic, when applied to security property verification, may erroneously remove structural data paths 502C and 504C and lead to incorrect verification results. Blackboxing a portion of the design logic may include the scenario where the verification engine is instructed to ignore or remove portion of the design logic from the verification flow to, for example, avoid unnecessary or undesired, long runtime for verifying the portion of the design logic. Unlike conventional verification techniques which may erroneously remove the structural data paths, the data propagation diagram generation mechanism 106B is designed to detect the scenario when a blackbox is erroneously removing such path and prompt the user to correct the blackbox setup in order to create a correct data propagation diagram, and to pass verification configuration to the verification engine in 112B. In addition to those techniques described above, some embodiments may iteratively augment the data paths to determine which portions of a circuit are reachable or unreachable and which portions of the circuit are harder to prove or disprove for the verification engine.

Figure 5D:
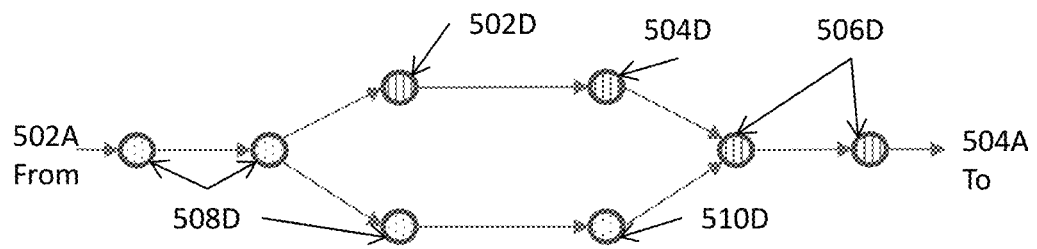

FIG. 5D illustrates a state during a proof progress where concrete verification results for nodes 502D, 504D, and 506D (506D is marked on two nodes) cannot be determined, and nodes 510D and 508D (508D is marked on three nodes) have been proven to be reachable. For the helper property "-from 502A -to 502D" of node 502D if its undetermined status continues for an extended period of time, node 502D may be determined to be the potential source of complexity at this stage of the proof flow illustrated in FIG. 5D. This determination is at least partially due to the fact that this node is in the paths for all remaining undetermined nodes.

Figure 5E:
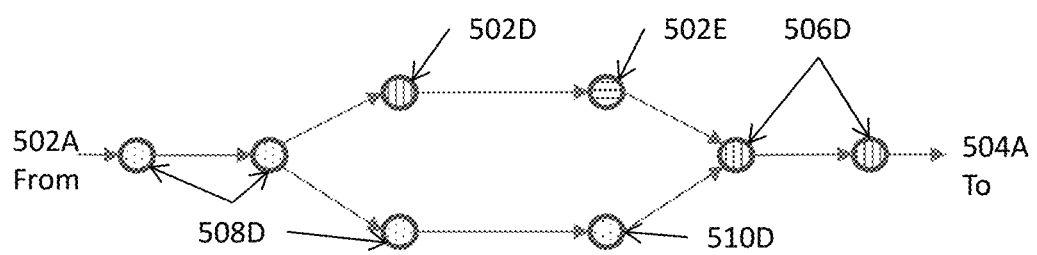
Figure 5F:
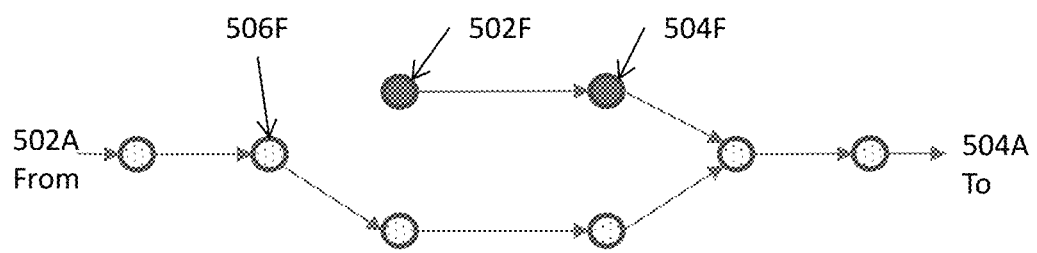

FIG. 5E illustrates a subsequent state during the proof progress illustrated in FIG. 5D. For the helper property "-from 502A -to 502E" of node 502E, the proof progress has determined that it is unreachable, in spite of the fact that the helper property "-from 502A -to -502D" is still not determined. FIG. 5E further shows that nodes 510D and 508D (508D is marked on three nodes) remain reachable, that node 502E has been proven to be unreachable, and that nodes 502D and 506D (marked on two nodes) remain undetermined. Although node 502D in FIG. 5E remains undetermined, node 502E cannot be reached regardless of whether node 502D is reachable or unreachable. Therefore, some embodiments may trim the path between nodes 506F and 502F as illustrated in FIG. 5F.

The trimming operation can be performed in many ways. For example, when the helper property "-from 502A -to 502E" is determined to be unreachable, this determination may be used to remove states from the search space by adding an assumption that the data location corresponding to node 502A cannot reach the data location corresponding to node 502E and passing the assumption to the verification engine 112B, reduce the effort required by the verification engine to prove the helper properties generated for one or more other nodes. FIG. 5F further illustrates the effect of the trimming operation on the data propagation display mechanism 116B, where the annotated data propagation diagram after the completion of the verification flow where nodes 502F and 504F are now annotated as unprocessed nodes, and the remaining nodes are annotated as reachable with different graphical emphasis.

System Architecture Overview

Figure 6:
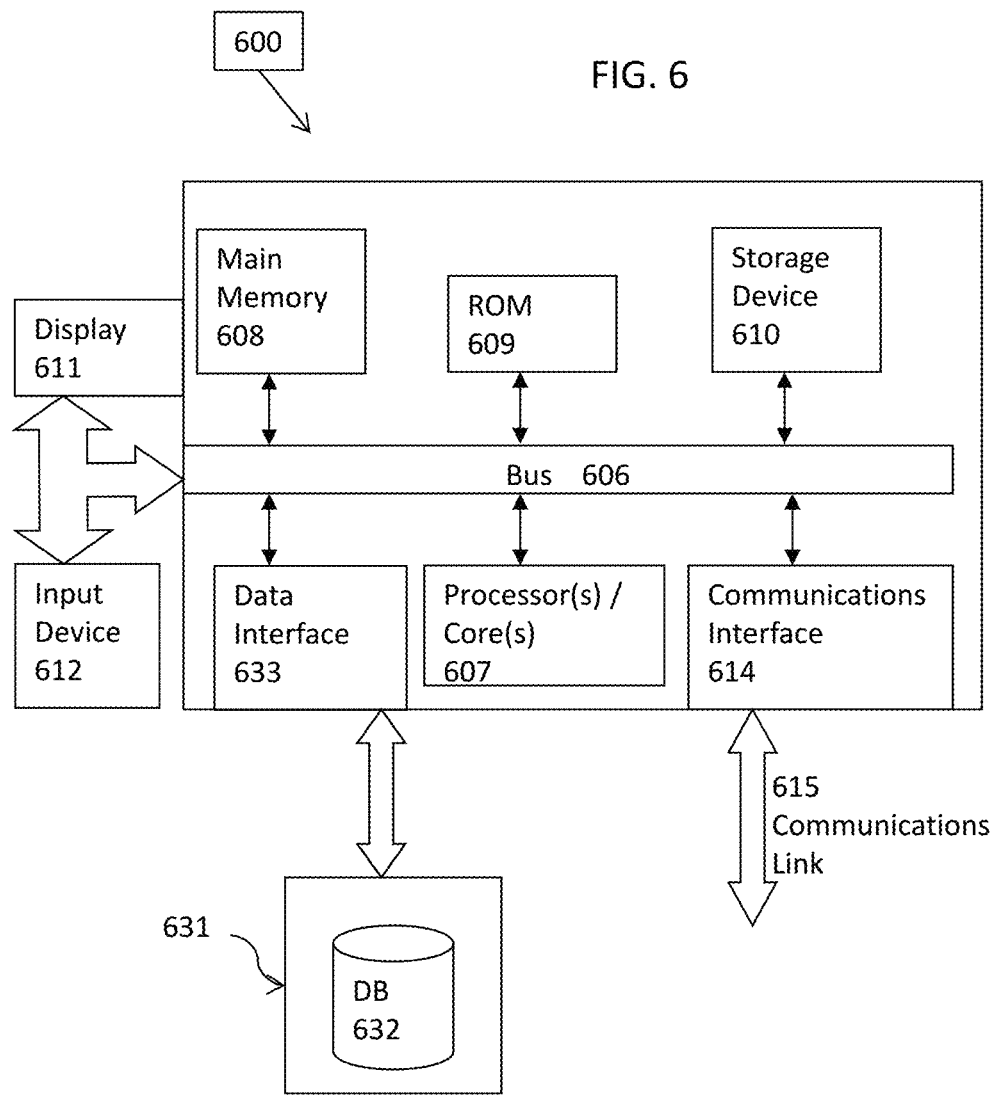
FIG. 6 illustrates a computerized system on which a method for verifying an electronic design with a graph-based proof flow may be implemented.

FIG. 6 illustrates a block diagram of a simplified illustration of a specially programmed computing system 600 on which a method for verifying an electronic design with a graph-based proof flow as described in the preceding paragraphs with reference to various figures. Computer system 600 includes a bus 606 (e.g., a system bus, an external bus, etc.) or other communication mechanisms for communicating information, which interconnects subsystems and devices, such as processor 607, system memory 608 (e.g., RAM), static storage device 609 (e.g., ROM), disk drive 610 (e.g., magnetic or optical), communication interface 614 (e.g., modem or Ethernet card), display 611 (e.g., CRT or LCD), input device 612 (e.g., keyboard), and cursor control (not shown).

According to one embodiment, computer system 600 performs specific operations by one or more processor or processor cores 607 executing one or more sequences of one or more instructions in system memory 608. Such instructions may be read into system memory 608 from another computer readable/usable storage medium, such as static storage device 609 or disk drive 610. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 607, where the one or more processors, one or more processor cores, or combination thereof executes one or more threads. For example, the acts or modules of determining or constructing a data propagation diagram or the act or module of determining one or more helper properties, verifying an electronic design model, determining a set of property data sources and destinations, performing a structural analysis, etc. described herein may be performed by one or more processors, one or more processor cores, or combination thereof. A mechanisms described herein may also be implemented as a pure hardware module (e.g., a block of electronic circuit components) or a combination of a hardware module and a software block that jointly perform various tasks to achieve various functions or purposes described herein or equivalents thereof. For example, a mechanism described herein may be implemented as an application-specific integrated circuit (ASIC) in some embodiments. A mechanism described herein or an equivalent thereof may perform its respective functions alone or in conjunction with one or more other mechanisms. A mechanism described herein or an equivalent thereof may thus invoke one or more other mechanisms by, for example, issuing one or more commands or function calls. The invocation of one or more other mechanisms may be fully automated or may involve one or more user inputs.

The term "computer readable storage medium" or "computer usable storage medium" as used herein refers to any medium that participates in providing instructions to processor 607 for execution. Such a medium may take many forms, including but not limited to, non-volatile media and volatile media. Non-volatile media includes, for example, optical or magnetic disks, such as disk drive 610. Volatile media includes dynamic memory, such as system memory 608. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 600. According to other embodiments of the invention, two or more computer systems 600 coupled by communication link 615 (e.g., LAN, PTSN, or wireless network) may perform the sequence of instructions required to practice the invention in coordination with one another.

Computer system 600 may transmit and receive messages, data, and instructions, including program, i.e., application code, through communication link 615 and communication interface 614. Received program code may be executed by processor 607 as it is received, and/or stored in disk drive 610, or other non-volatile storage for later execution. In an embodiment, the computer system 600 operates in conjunction with a data storage system 631, e.g., a data storage system 631 that includes a database 632 that is readily accessible by the computer system 600. The computer system 600 communicates with the data storage system 631 through a data interface 633. A data interface 633, which is coupled to the bus 606 (e.g., memory bus, system bus, data bus, etc.), transmits and receives electrical, electromagnetic or optical signals that include data streams representing various types of signal information, e.g., instructions, messages and data. In embodiments of the invention, the functions of the data interface 633 may be performed by the communication interface 614.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for verifying an electronic design with a graph-based verification flow, comprising:
   determining a data propagation diagram for an electronic design model of an integrated circuit at least by identifying a set of data locations as a plurality of nodes connected by a plurality of connections identified as a plurality of edges in the data propagation diagram of the electronic design model, wherein
      a data location includes a circuit component storing signal values in the electronic design model;
   determining, at a helper property generation module that is stored at least partially in memory of a computing system and functions in tandem with at least one processor executing a sequence of instructions, a set of helper properties for the data propagation diagram at least by traversing at least a portion of the data propagation diagram and reducing a search space for a verification engine at least by removing from verification at least one node determined to be unreachable, wherein a helper property is used to help verify at least another property for the electronic design model;
   verifying the electronic design model with the verification engine that examines at least one helper property and determines whether the at least one helper property is verified to generate verification results for the electronic design model; and
   implementing the electronic design model of the integrated circuit based in part or in whole upon the verification results.

2. The computer implemented method of claim 1, wherein the electronic design model comprises a register transfer level (RTL) model.

3. The computer implemented method of claim 1, determining the data propagation diagram comprising:
   determining the set of data locations from the electronic design model, the set of data locations comprising a plurality of source data locations or a plurality of destination data locations; and
   selecting a source data location or a destination data location from the set.

4. The computer implemented method of claim 3, determining the data propagation diagram further comprising:
   performing a structural analysis by using the at least one processor that starts at the source data location or destination data location and traverses the electronic design model forwards or backwards to determine a plurality of structural paths for the electronic design model.

5. The computer implemented method of claim 4, determining the data propagation diagram further comprising:
   constructing the data propagation diagram with the data propagation diagram generation module that uses the set of data locations as the plurality of nodes and uses the plurality of structural paths as the plurality of connections in the data propagation diagram.

6. The computer implemented method of claim 1, determining the set of helper properties comprising:
   accessing the data propagation diagram via a bus architecture and determining a set of nodes in the data propagation diagram with the helper property generation module;
   selecting a node from the set of nodes in the data propagation diagram with the helper property generation module; and
   generating the set of helper properties with the helper property generation module that processes the data propagation diagram from the node to at least one remaining node in the set of nodes.

7. The computer implemented method of claim 1, further comprising:
   identifying a smaller subset of the set of helper properties with a verification flow management module including the at least one processor that accesses the set of helper properties via a bus architecture or a network component and selects the smaller subset of the set of helper properties.

8. The computer implemented method of claim 1, further comprising:
   presenting verification progress with a data propagation display \module including the at least one processor that transforms a representation of the data propagation diagram by annotating the representation of the data propagation diagram with at least a portion of the verification results into an annotated representation of the data propagation diagram to provide visual aid of the verification progress or to indicate the sources of complexity.

9. The computer implemented method of claim 8, further comprising:
   presenting the verification progress with the data propagation display module that temporally synchronizes the annotated representation of the data propagation diagram with one or more waveforms of one or more traces in the electronic design model over one or more clock cycles.

10. The computer implemented method of claim 1, further comprising:
    trimming the search space into a smaller search space with the at least one processor that identifies and uses one or more verified helper properties to determine one or more new start states or one or more unreachable states;
    enhancing efficiency or performance of the verification engine during a verification flow for the electronic design model by directing the verification engine to search the smaller search space for a remainder of a verification flow for the electronic design model; and
    enhancing the efficiency or performance of the verification engine during the verification flow for the electronic design model by starting a search from a state closer to a verification target.

11. The computer implemented method of claim 1, further comprising:
    identifying a selection of at least a portion of the data propagation diagram;

determining a modified configuration by applying a modification to a configuration that corresponds to the selection; and modifying the graph-based verification flow with the modified configuration.

12. An article of manufacture comprising a non-transitory computer accessible storage medium having stored thereupon a sequence of instructions which, when executed by at least one processor, causes the at least one processor to perform a process for verifying an electronic design with a graph-based verification flow, the process comprising:

determining a data propagation diagram for an electronic design model of an integrated circuit at least by identifying a set of data locations as a plurality of nodes connected by a plurality of connections identified as a plurality of edges in the data propagation diagram of in the electronic design model, wherein a data location includes a circuit component storing signal values in the electronic design model;

determining, at a helper property generation module that is stored at least partially in memory of a computing system functions in tandem with the at least one processor executing a sequence of instructions, a set of helper properties for the data propagation diagram at least by traversing at least a portion of the data propagation diagram and reducing a search space for a verification engine at least by removing from verification at least one node determined to be unreachable, wherein a helper property is used to help verify at least another property for the electronic design model;

verifying the electronic design model with the verification engine that examines at least one helper property and determines whether the at least one helper property is verified to generate verification results for the electronic design model; and implementing the electronic design model of the integrated circuit based in part or in whole upon the verification results.

13. The article of manufacture of claim 12, further comprising the sequence of instructions which, when executed by at least one processor, causes the at least one processor to perform the process that further comprises:

determining the set of data locations from the electronic design model, the set of data locations comprising a plurality of source data locations or a plurality of destination data locations;

selecting a source data location or a destination data location from the set;

performing a structural analysis by using the at least one process that starts at the source data location or destination data location and traverses the electronic design model forwards or backwards to determine a plurality of data propagation paths for the electronic design model; and constructing the data propagation diagram with the data propagation diagram generation module that uses the set of data locations as a plurality of nodes and uses the plurality of data propagation paths as the plurality of connections in the data propagation diagram.

14. The article of manufacture of claim 12, further comprising the sequence of instructions which, when executed by at least one processor, causes the at least one processor to perform the process that further comprises:

accessing the data propagation diagram via a bus architecture and determining a set of nodes in the data propagation diagram with the helper property generation module;

selecting a node from the set of nodes in the data propagation diagram with the helper property generation module;

generating the set of helper properties with the helper property generation module that processes the data propagation diagram from the node to at least one remaining node in the set of nodes; and identifying a smaller subset of the set of helper properties with a verification flow management module including the at least one processor that accesses the set of helper properties via a bus architecture or a network component and selects the smaller subset of the set of helper properties.

15. The article of manufacture of claim 12, further comprising the sequence of instructions which, when executed by at least one processor, causes the at least one processor to perform the process that further comprises:

presenting verification progress with a data propagation display module-including the at least one processor that transforms a representation of the data propagation diagram by annotating the representation of the data propagation diagram with at least a portion of the verification results into an annotated representation of the data propagation diagram to provide visual aid of the verification progress;

presenting the verification progress with the data propagation display module allowing identification of one or more bottlenecks; and presenting the verification progress with the data propagation display module—that temporally synchronizes the annotated representation of the data propagation diagram with one or more waveforms of one or more traces in the electronic design model over one or more clock cycles.

16. The article of manufacture of claim 12, further comprising the sequence of instructions which, when executed by at least one processor, causes the at least one processor to perform the process that further comprises:

trimming the search space into a smaller search space with the at least one processor that identifies and uses one or more verified helper properties to determine one or more new start states or one or more unreachable states;

enhancing efficiency or performance of the verification engine during a verification flow for the electronic design model by directing the verification engine to search the smaller search space for a remainder of a verification flow for the electronic design model; and enhancing the efficiency or performance of the verification engine during the verification flow for the electronic design model by starting a search from a state closer to a verification target than from a default state.

17. A system for verifying an electronic design with a graph-based verification flow, comprising:

non-transitory computer accessible storage medium storing thereupon program code;

a data propagation diagram generation module that determines a data propagation diagram for an electronic design model of an integrated circuit at least by identifying a set of data locations as a plurality of nodes connected by a plurality of connections identified as a plurality of edges in the data propagation diagram of the electronic design model, wherein a data location includes a circuit component storing signal values in the electronic design model;

a helper property generation module that is stored at least partially in memory and executes the program code to determine a set of helper properties for the data propagation diagram at least by traversing at least a portion of the data propagation diagram and reducing a search space for a verification engine at least by removing from verification at least one node determined to be unreachable, wherein a helper property is used to help verify at least another property for the electronic design model;

a verification engine that that verifies the electronic design model by examining at least one helper property and determining whether the at least one helper property is verified to generate verification results for the electronic design model; and implement the electronic design model of the integrated circuit based in part or in whole upon the verification results.

18. The system of claim 17, further comprising
the data propagation diagram module that is configured to determine the set of data locations from the electronic design model, select a source data location or a destination data location from the set, perform a structural analysis that starts at the source data location or destination data location and traverses the electronic design model forwards or backwards to determine a plurality of data propagation paths for the electronic design model, and construct the data propagation diagram by using the set of data locations as the plurality of nodes and by using the plurality of structural paths as the plurality of connections in the data propagation diagram.

19. The system of claim 17, further comprising
the helper property generation module that executes the program code to access the data propagation diagram to determine a set of nodes in the data propagation diagram, select a node from the set of nodes in the data propagation diagram, generate the set of helper properties by processing the data propagation diagram from the node to at least one remaining node in the set of nodes; and the verification flow management module that executes the program code to identify a smaller subset of the set of helper properties by accessing the set of helper properties via a bus architecture or a network component and by selecting the smaller subset of the set of helper properties.

20. The system of claim 17, further comprising
the data propagation display module that executes the program code to present verification progress by transforming a representation of the data propagation diagram and annotating the representation of the data propagation diagram with at least a portion of the verification results into an annotated representation of the data propagation diagram to provide visual aid of the verification progress, to allow the identification of bottlenecks, and to present the verification progress by temporally synchronizing the annotated representation of the data propagation diagram with one or more waveforms of one or more traces in the electronic design model over one or more clock cycles.

21. The system of claim 17, further comprising
the verification flow management module that executes the program code to trim a search space into a smaller search space by identifying and using one or more verified helper properties to determine one or more new start states and one or more unreachable states, and to enhance efficiency or performance of the verification engine during a verification flow for the electronic design model by directing the verification engine to search the smaller search space for a remainder of the verification flow for the electronic design model, or by starting the verification from one or more new states, which may be closer to the final state than the design reset state.

* * * * *